(12) United States Patent
Ryu (10) Patent No.: US 10,186,506 B2
(45) Date of Patent: Jan. 22, 2019

(54) ELECTROSTATIC DISCHARGE CIRCUIT

(71) Applicant: FAIRCHILD KOREA SEMICONDUCTOR, LTD., Bucheon (KR)

(72) Inventor: Junhyeong Ryu, Incheon (KR)

(73) Assignee: Semiconductor Components Industries, LLC, Pheonix, AZ (US)

( * ) Notice: Subject to any disclaimer, the term of this patent is extended or adjusted under 35 U.S.C. 154(b) by 0 days.

(21) Appl. No.: 15/654,392

(22) Filed: Jul. 19, 2017

(65) Prior Publication Data
US 2018/0090481 A1     Mar. 29, 2018

(30) Foreign Application Priority Data

Sep. 26, 2016   (KR) .................. 10-2016-0123408

(51) Int. Cl.

| H01L 27/02 | (2006.01) |
|---|---|
| H01L 29/861 | (2006.01) |
| H01L 27/098 | (2006.01) |
| H01C 17/065 | (2006.01) |
| H01L 29/732 | (2006.01) |

(52) U.S. Cl.
CPC ... H01L 27/0266 (2013.01); H01C 17/06546 (2013.01); H01L 27/0259 (2013.01); H01L 27/098 (2013.01); H01L 29/8618 (2013.01); H01L 29/732 (2013.01); H01L 2924/0002 (2013.01)

(58) Field of Classification Search
CPC ............ H01L 27/0266; H01L 27/0259; H01L 27/098; H01L 29/8618; H01L 29/732
See application file for complete search history.

(56) References Cited

U.S. PATENT DOCUMENTS

| 6,239,463 | B1 | 5/2001 | Williams et al. | |
|---|---|---|---|---|
| 6,441,437 | B1* | 8/2002 | Gossner | H01L 27/0248 257/355 |
| 6,683,362 | B1 | 1/2004 | O et al. | |
| 9,614,369 | B2* | 4/2017 | Laine | H02H 9/046 |
| 9,659,922 | B2* | 5/2017 | Zhan | H01L 27/0262 |
| 9,831,232 | B2* | 11/2017 | Hong | H01L 27/0262 |
| 2003/0047750 | A1* | 3/2003 | Russ | H01L 27/0262 257/173 |
| 2005/0151160 | A1* | 7/2005 | Salcedo | H01L 27/0262 257/173 |
| 2006/0151836 | A1* | 7/2006 | Salcedo | H01L 27/0262 257/362 |
| 2008/0237704 | A1* | 10/2008 | Williams | H01L 21/761 257/338 |
| 2008/0253046 | A1* | 10/2008 | Lou | H01L 27/0262 361/56 |

(Continued)

*Primary Examiner* — Nathan W Ha
(74) *Attorney, Agent, or Firm* — Brake Hughes Bellermann LLP (57) ABSTRACT

An electrostatic discharge circuit may include a substrate, an N+ buried layer in the substrate, an n-type epitaxial layer on the N+ buried layer and the substrate, a first P− region in an anode region of the n-type epitaxial layer, a first N+ region in the first P− region, an N-well in a cathode region of the n-type epitaxial layer, a first P+ region in the N-well, and a second N+ region located in the N-well. The first N+ region may be located closer to the second N+ region than the first P+ region.

20 Claims, 9 Drawing Sheets

(56) References Cited

U.S. PATENT DOCUMENTS

| | | | |
|---|---|---|---|
| 2011/0284922 A1* | 11/2011 | Salcedo | H01L 27/0262 257/119 |
| 2014/0111892 A1 | 4/2014 | Chen et al. | |
| 2016/0005730 A1* | 1/2016 | Zhan | H01L 27/0262 438/311 |
| 2017/0236816 A1* | 8/2017 | Tsai | H01L 27/0255 257/112 |

* cited by examiner

ELECTROSTATIC DISCHARGE CIRCUIT

RELATED PATENT APPLICATION

The present application claims the benefit of and priority to the Korean Patent Application 10-2016-0123408 filed on Sep. 26, 2016, which is incorporated herein by reference in its entirety.

TECHNICAL FIELD

This description generally relates to an electrostatic discharge circuit and a manufacturing method thereof.

BACKGROUND

An electrostatic discharge circuit is applied to a semiconductor circuit to prevent the semiconductor circuit from malfunctioning (e.g., damaged or broken) due to electrostatic discharge (ESD). Devices, such as a silicon controlled rectifier (SCR), an NPN bipolar transistor with an open base, or the like may be used during ESD.

A voltage at which current starts to flow through an electrostatic discharge circuit is referred to as a trigger voltage. When the trigger voltage is high, elements of a semiconductor circuit may be damaged or broken before ESD is performed by the electrostatic discharge circuit.

After the electrostatic discharge circuit is triggered, a cathode voltage of the electrostatic discharge circuit is maintained to be constant. This voltage is referred to as a holding voltage. When the holding voltage is low, the semiconductor circuit may malfunction. Furthermore, a latch-up phenomenon may occur in the electrostatic discharge circuit.

SUMMARY

In one general aspect, an electrostatic discharge circuit may include a substrate, an N+ buried layer in the substrate, an n-type epitaxial layer on the N+ buried layer and the substrate, a first P− region in an anode region of the n-type epitaxial layer, a first N+ region in the first P− region, an N-well in a cathode region of the n-type epitaxial layer, a first P+ region in the N-well, and a second N+ region located in the N-well. The first N+ region may be located closer to the second N+ region than the first P+ region.

Implementations can include one of more of the following features. For example, the electrostatic discharge circuit may include a second P− region and a first N− region in the N-well. The first P+ region may be located in the second P− region, and the second N+ region may be located in the first N− region.

In some implementations, the electrostatic discharge circuit may include a second P+ region located in the first P− region, the second P+ region being at a left side of the first N+ region and a third P+ region located in the first P− region, the third P+ region being at a right side of the first N+ region. The first P+ region and the second N+ region may be connected to a cathode terminal, and the first N+ region may be connected to an anode terminal.

In some implementations, the electrostatic discharge circuit may include a first transistor including the first P+ region, the N-well, and the first P− region, a second transistor including the N-well, the first P− region, and the first N+ region, and a resistor of the N-well.

In some implementations, the electrostatic discharge circuit may include a P+ buried layer located in a sub-region on the substrate, wherein a location of the sub-region is different from a location of the N+ buried layer, a P-well on the P+ buried layer in the n-type epitaxial layer, a third P− region in the P-well, and a fourth P+ region in the third P− region.

In some implementations, the electrostatic discharge circuit may include a first transistor including the first P+ region, the N-well, and the first P− region, a second transistor including the N-well, the first P− region, and the first N+ region, a resistor of the N-well, and a third transistor including the first P− region, the n-type epitaxial layer, and the third P− region. The fourth P+ region may be connected to the substrate.

In some implementations, the electrostatic discharge circuit may include a second N− region located in the N-EPI, the second N-region being symmetrical to the N-well with respect to the first P− region, and a third N+ region in the second N− region. The first P+ region, the second N+ region, and the third N+ region may be connected to a cathode terminal, and the first N+ region may be connected to an anode terminal.

In another general aspect, a method of manufacturing an electrostatic discharge circuit may include forming an N+ buried layer in a substrate, forming an n-type epitaxial layer on the N+ buried layer and the substrate, forming an N-well by doping n type ions in a cathode region of the n-type epitaxial layer, forming a first P− region and a second P− region by doping p type ions on an anode region of the n-type epitaxial layer and a portion region of the N-well, forming a first N− region by doping n type ions on another region of the N-well, forming a first N+ region and a second N+ region by doping n type ions on some regions corresponding to a center of the first P− region and some regions of the first N− region, and forming a first P+ region by doping p type ions on some regions of the second P− region. The second N+ region may be located in the N-well. The first N+ region may be located closer to the second N+ region than the first P+ region.

Implementations can include one of more of the following features. For example, the method may include forming a second P+ region by doping p type ions on a left region of the first N+ region in the first P− region, and a third P+ region by doping p type ions on a right region of the first N+ region in the first P− region.

In some implementations, the method may include forming a cathode electrode on each of the first P+ region and the second N+ region, and forming an anode electrode on the first N+ region. The forming of the N+ buried layer may include implanting high-concentration n type ions into all the cathode and anode regions.

In some implementations, the method may include forming a P+ buried layer in a first sub-region on the substrate, a location of the first sub-region is different from a location of a second sub-region of the N+ buried layer, forming a P-well by doping p type ions on the P+ buried layer, forming a third P− region by doping p type ions on a portion region of the P-well, and forming a fourth P+ region by doping p type ions on some regions of the third P− region. The forming of the P+ buried layer may include implanting high-concentration p type ions into the second sub-region.

DETAILED DESCRIPTION OF EXAMPLE EMBODIMENTS

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Furthermore, the figures are intended to illustrate the general characteristics of methods and/or structure utilized in certain example embodiments and to supplement the written description provided below. These figures are not, however, to scale and may not precisely reflect the precise structural or performance characteristics of any given embodiment, and should not be interpreted as defining or limiting the range of values or properties encompassed by example embodiments. For example, the structural elements may be reduced or exaggerated for clarity. The use of similar or identical reference numbers in the various drawings is intended to indicate the presence of a similar or identical element or feature.

Example embodiments relate to an electrostatic discharge circuit capable of being stably operated. For example, when a trigger voltage, a holding voltage, and a breaking current are taken into account, the electrostatic discharge may be provided more stably in the electrostatic discharge circuit according to example embodiments.

Figure 1:
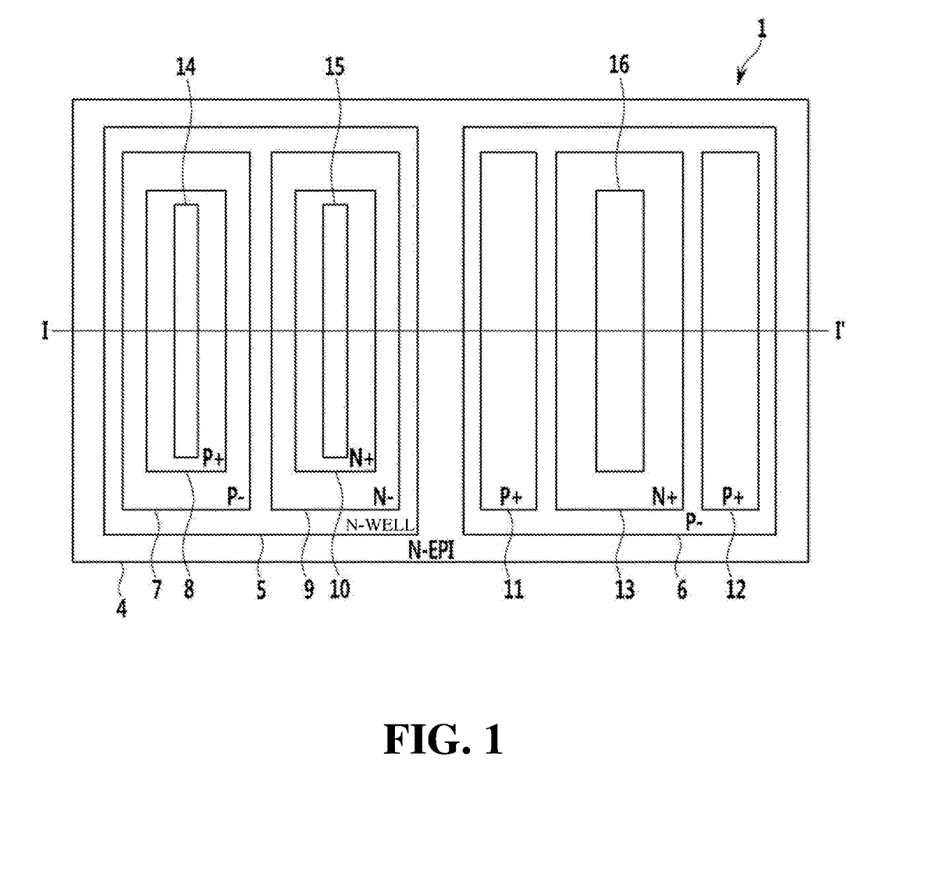
FIG. 1 is a plan view of an electrostatic discharge circuit according to an example embodiment.
Figure 2:
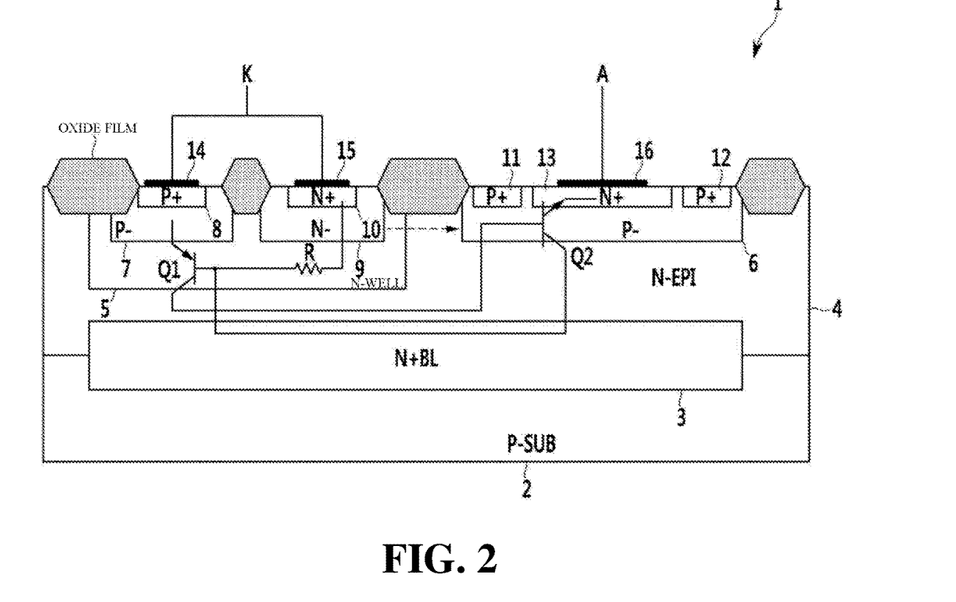
FIG. 2 is a cross-sectional view of the electrostatic discharge circuit of FIG. 1 taken along line I-I'.
Figure 3:
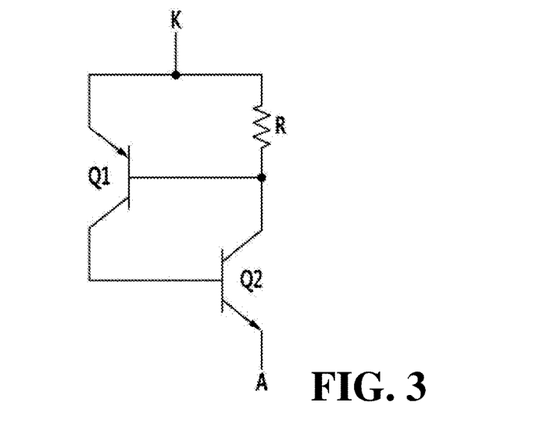
FIG. 3 is a diagram illustrating an equivalent circuit of the electrostatic discharge circuit according to an example embodiment.

FIG. 1 is a plan view of an electrostatic discharge circuit 1 according to an example embodiment. FIG. 2 is a cross-sectional view of the electrostatic discharge circuit 1 of FIG. 1 taken along line I-I'. FIG. 3 is an equivalent circuit diagram of the electrostatic discharge circuit 1 according to an example embodiment.

Referring to FIG. 1, the electrostatic discharge circuit 1 may include an n-type epitaxial (N-EPI) layer 4, an n-type well (N-well) 5, a P− region 6 of an anode region, a P− region 7 of a cathode region, a P+ region 8 of the cathode region, an N− region 9 of the cathode region, an N+ region 10 of the cathode region, two P+ regions 11 and 12 of the anode region, an N+ region 13 of the anode region, two cathode electrodes 14 and 15, and an anode electrode 16.

The two cathode electrodes 14 and 15 may be electrically connected to each other and may be connected to a cathode terminal K. The anode electrode 16 may be connected to an anode terminal A. Although FIG. 1 illustrates each of the two cathode electrodes 14 and 15 and the anode electrode 16 as one electrode, there may be other configurations of the cathode electrode(s) and/or the anode electrode(s). For example, a plurality of cathode electrodes may be formed in the P+ region 8 and the N+ region 10. For another example, a plurality of anode electrodes may be formed in the N+ region 13.

Referring to FIG. 2, the electrostatic discharge circuit 1 may include a P-type substrate (P-SUB) 2 and an N+ buried layer (BL) 3. In some implementations, the N+BL 3 may be formed on the P-SUB 2. The N-EPI layer 4 may be formed on the N+BL 3 and the P-SUB 2.

In some implementations, as shown in FIG. 2 (but not shown in FIG. 1), an oxide film may be formed on a surface of the electrostatic discharge circuit 1. For example, the oxide film may be formed on the N-EPI layer 4.

Referring to FIGS. 1 and 2, the N-well 5 may be formed in a region in the N-EPI layer 4 corresponding to the cathode region, and the P− region 7 and the N− region 9 may be respectively formed in regions in the N-well 5 corresponding thereto. For example, in the region (left region) in the N-EPI layer 4 corresponding to the cathode region, the P− region 7 may be formed in a left region in the N-well 5 and the N− region 9 may be formed in a right region in the N-well 5. The P+ region 8 may be formed in the P− region 7, and the N+ region 10 may be formed in the N− region 9. The cathode electrode 14 may be formed on the P+ region 8, and the cathode electrode 15 may be formed on the N+ region 10.

The P− region 6 may be formed in a region in the N-EPI layer 4 corresponding to the anode region. The P+ region 11, the P+ region 12, and the N+ region 13 may be respectively formed in regions in the P− region 6 corresponding thereto. For example, in the region (right region) in the N-EPI layer 4 corresponding to the anode region, the P+ region 11 may be formed in a left region in the P− region 6, the P+ region 12 may be formed in a right region in the P− region 6, and the N+ region 13 may be formed in a portion of a region corresponding to a center of the P− region 6. The anode electrode 16 may be formed on the N+ region 13. In some implementations, the anode electrode 16 is formed only on the N+ region 13 and not the P+ regions 11, 12. In some implementations, the P− region 6 may not be in contact with anode electrode 16.

FIG. 3 is a diagram illustrating an equivalent circuit of the electrostatic discharge circuit 1. As shown in FIG. 3, the electrostatic discharge circuit 1 may include two transistors Q1 and Q2 and a resistor R.

Referring back to FIG. 2, the transistor Q1 may be a PNP bipolar transistor including the P+ region 8, the N-well 5, and the P− region 6. The transistor Q2 may be an NPN bipolar transistor including the N-EPI layer 4, the P− region 6, and the N+ region 13. In some implementations, the resistor R represents a resistance component of the N-well 5.

A collector of the transistor Q1 may be connected to the cathode terminal K. A base of the transistor Q1 may be connected to the cathode terminal K via the resistor R. An emitter of the transistor Q1 may be connected to a base of the transistor Q2. A collector of the transistor Q2 may be connected to the cathode terminal K via the resistor R. An emitter of the transistor Q2 may be connected to the anode terminal A.

In some implementations, a punch-through may occur between the N-EPI 6 and the N+ region 13 due to a voltage of static electricity flowing to the cathode terminal K, and thus turning on the transistor Q2.

In some implementations, current I1 of the turned-on transistor Q2 may flow through the resistor R, and the transistor Q1 may be turned on by a voltage drop that occurs in the resistor R. The transistor Q2 may be maintained to be turned on by the turned-on transistor Q1.

A voltage at which the transistor Q1 and the transistor Q2 are turned on as illustrated in example embodiments is referred to as a trigger voltage.

When the electrostatic discharge circuit 1 is triggered, the transistor Q2 does not need to be biased by current supplied using the transistor Q1, and thus a cathode voltage K decreases to a minimum value. This voltage is referred to as a holding voltage. Thereafter, the electrostatic discharge circuit 1 may be operated in a latch mode and may discharges static electricity flowing through the cathode terminal K.

In some implementations, the P− region 7 and the N− region 9 may be selectively included in the electrostatic discharge circuit 1 to control an avalanche breakdown voltage. For example, the P− region 7 and the N− region 9 may decrease the avalanche breakdown voltage. That is, the avalanche breakdown voltage, when the electrostatic discharge circuit 1 includes the P− region 7 and the N− region 9, may be lower as compared to when the electrostatic discharge circuit 1 does not include the P− region 7 and the N− region 9. This may decrease the trigger voltage. In some implementations, the P− region 7 and/or the N− region 9 may be excluded from the N-well 5.

In some implementations, the P+ region 11 and the P+ region 12 may protect opposite side surfaces of the N+ region 13. For example, current caused by static electricity may flow in a horizontal direction as indicated by a dotted arrow of FIG. 2. In this case, a path of the flow of the current in the horizontal direction may be blocked by the P+ region 11 doped with high-concentration P type ions.

Furthermore, the N− region 9 and the N+ region 10 may be formed closer to the P− region 6 of the anode region than the P− region 7 and the P+ region 8, thereby decreasing resistance between the collector and the cathode of the transistor Q2. Accordingly, the trigger voltage may decrease.

In some other implementations, the electrostatic discharge circuit may discharge current caused by static electricity generated by a terminal other than a cathode electrode and an anode electrode.

Figure 4:
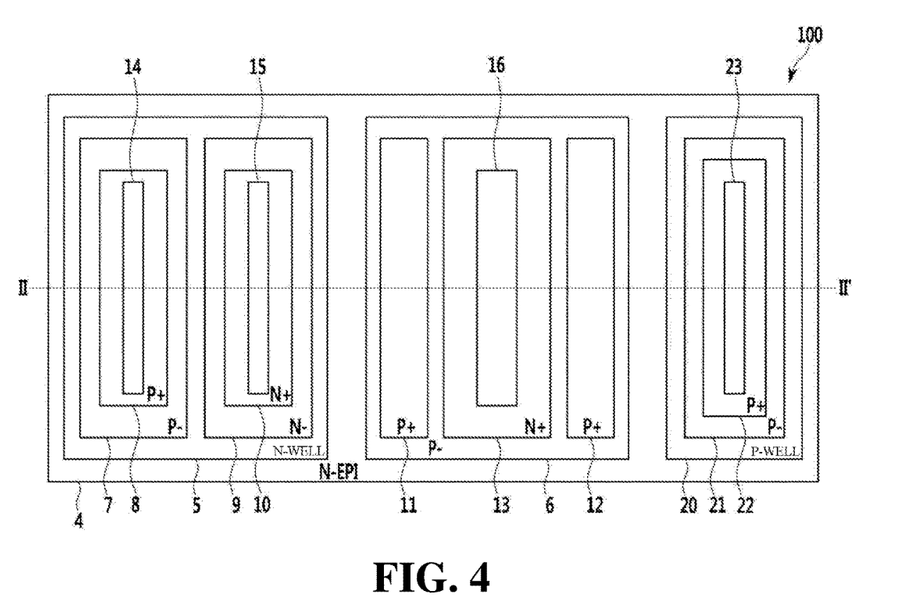
FIG. 4 is a plan view of an electrostatic discharge circuit according to another example embodiment.
Figure 5:
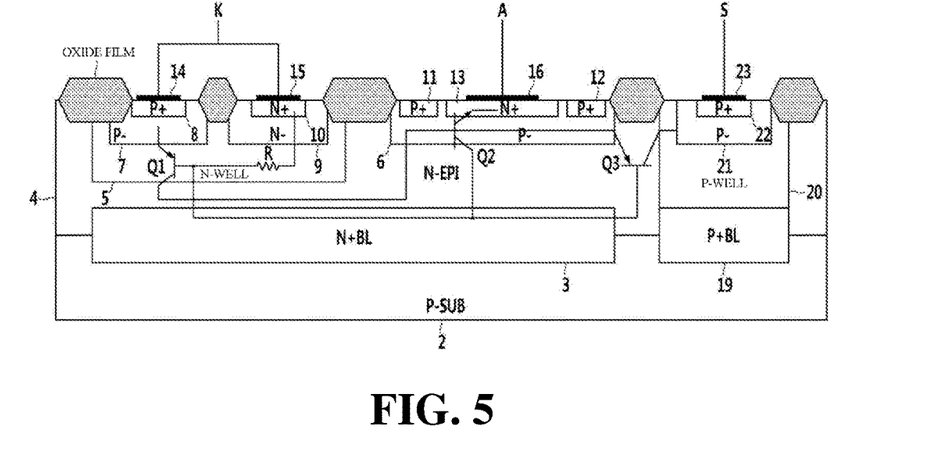
FIG. 5 is a cross-sectional view of the electrostatic discharge circuit of FIG. 4 taken along line II-II'.
Figure 6:
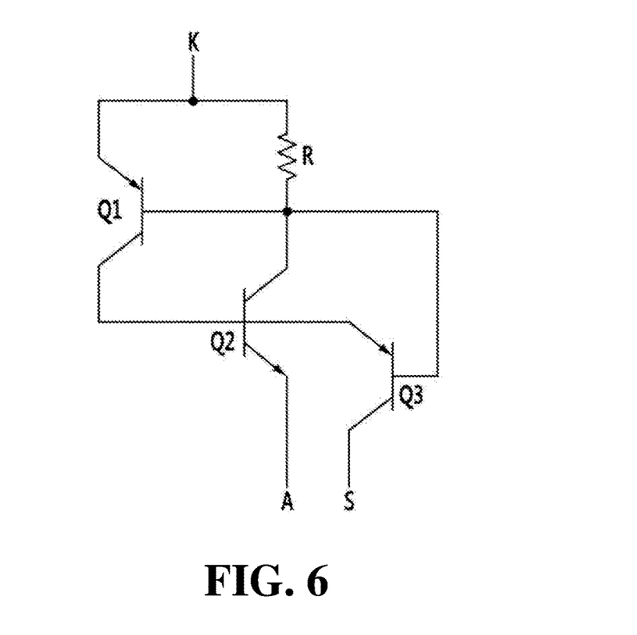
FIG. 6 is a diagram illustrating an equivalent circuit of the electrostatic discharge circuit according to another example embodiment.

FIG. 4 is a plan view of an electrostatic discharge circuit 100 according to another example embodiment. FIG. 5 is a cross-sectional view of the electrostatic discharge circuit 100 of FIG. 4 taken along line II-II'. FIG. 6 is a diagram illustrating an equivalent circuit of the electrostatic discharge circuit 100 according to FIG. 4.

Like elements described in FIGS. 4-6 that are the same as the elements of the embodiment described in FIGS. 1 to 3 will not be described in detail herein.

Referring to FIGS. 4 and 5, the electrostatic discharge circuit 100 may include a P+BL 19, a p-type well (P-well) 20, a P− region 21 of a sub-region, a P+ region 22 of the sub-region, and a sub-electrode 23. The sub-electrode 23 may be electrically connected to a terminal S.

Although FIG. 4 illustrates the sub-electrode 23 as one electrode, there may be other configurations of the sub-electrode(s). For example, a plurality of sub-electrodes 23 may be formed in the P+ region 22. The terminal S may be connected to a substrate.

Referring to FIG. 5, the P+BL 19 may be formed on the P-SUB 2 and the P-well 20 may be formed on the P+BL 19. The P− region 21 may be formed in the P-well 20. The P+ region 22 may be formed in the P− region 21. The sub-electrode 23 may be formed on the P+ region 22. In some implementations, as shown in FIG. 5 (but not shown in FIG. 4), an oxide film may be formed on a surface of the electrostatic discharge circuit 100. For example, the oxide film may be formed on the N-EPI layer 4.

In some implementations, as shown in FIG. 5, the sub-region may be formed at a right side of an anode region of the electrostatic discharge circuit 100. In some other implementations, the sub-region may be located at a left side of a cathode region of the electrostatic discharge circuit 100. For example, the P+BL 19, the P-well 20, the P− region 21, the P+ region 22, and the sub-electrode 23 may be formed at the left side of the cathode region of the electrostatic discharge circuit 100.

FIG. 6 is a diagram illustrating an equivalent circuit of the electrostatic discharge circuit 100. As shown in FIG. 6, the electrostatic discharge circuit 100 may include three transistors Q1, Q2, and Q3, and a resistor R. As compared to the equivalent circuit of FIG. 3, the electrostatic discharge circuit 100 may include the transistor Q3. As illustrated in, for example, FIG. 5, in some implementations, the transistor Q3 may be a PNP bipolar transistor including the P− region 21, an N-EPI layer 4, and a P− region 6.

In some implementations, a PN diode between a collector and a base of the transistor Q3 may conduct electric current when sub-bias current flows from the terminal S, and thus an electric potential of the P− region 21 increases and a voltage between the P− region 21 and the N-EPI layer 4 exceeds a forward bias voltage. Then the current flowing from the terminal S flows to a cathode terminal K via the resistor R.

FIGS. 7A to 7G are diagrams illustrating a process of manufacturing an electrostatic discharge circuit according to an example embodiment.

Figure 7A:
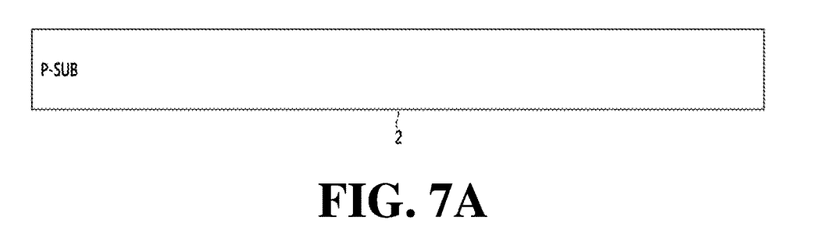
FIGS. 7A to 7G are diagrams illustrating a process of manufacturing an electrostatic discharge circuit according to an example embodiment.

Referring to FIG. 7A, a P-SUB 2, which is a p-type substrate, is initially formed.

Figure 7B:
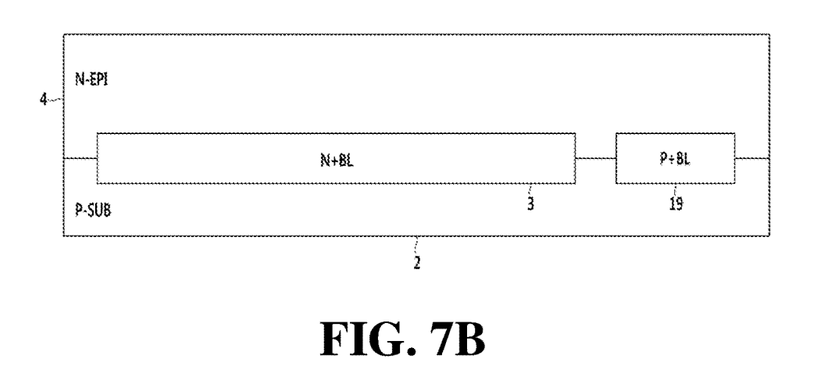

Referring to FIG. 7B, high-concentration ions may be implanted into some (a portion) regions of the P-SUB 2 to form an N+BL 3 and a P+BL 19. For example, high-concentration n type ions may be implanted into a first sub-region (e.g., all cathode and anode regions) of the P-SUB 2 to form the N+BL 3, and high-concentration p type ions may be implanted into a second sub-region to form the P+BL 19. In an exemplary embodiment as illustrated in FIG. 7B, the N+BL 3 and a P+BL 19 may be formed at the same level. In other words, bottom surfaces of the N+BL 3 and a P+BL 19 may be at the same plane in a horizontal direction.

Next, an N-EPI layer 4 may be formed on the P-SUB 2, the N+BL 3, and the P+BL 19 through epitaxial growth. In some implementations, the P+BL 19 may not be formed (e.g., manufactured) in accordance with the illustrated electrostatic discharge circuit 1 of FIG. 1.

Figure 7C:
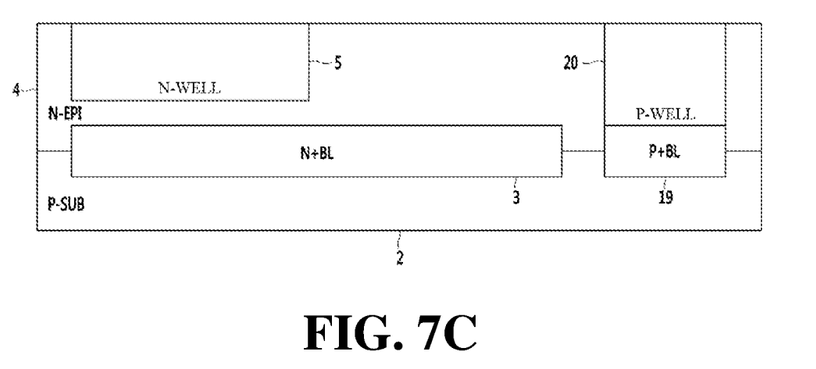

Referring to FIG. 7C, n type ions may be doped on a cathode region of the N-EPI layer 4 to form an N-well 5, and p type ions may be doped on a sub-region of the N-EPI layer 4 on which the P+BL 19 is formed to form a P-well 20. In some implementations, the P-well 20 may not be formed (e.g., manufactured) in accordance with the illustrated electrostatic discharge circuit 1 of FIG. 1.

Figure 7D:
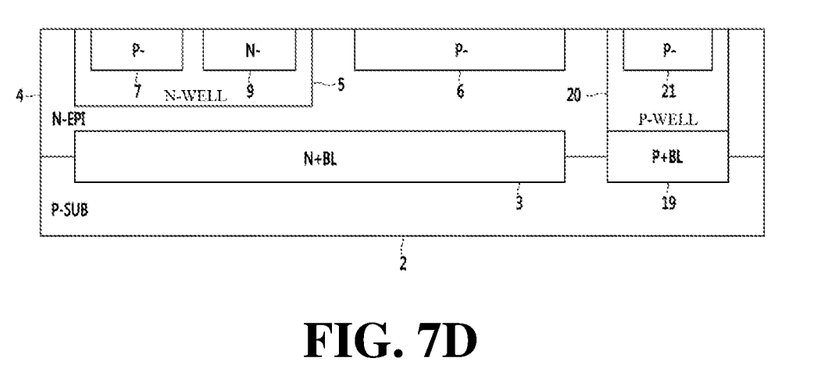
Figure 7E:
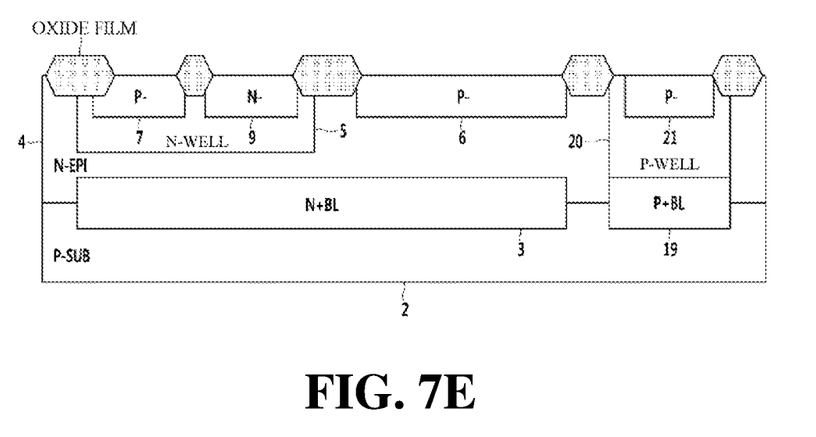

Referring to FIG. 7D, p type ions may be doped on a left region of the N-well 5, an anode region of the N-EPI layer 4, and a portion of a region of the P-well 20 to form a P− region 7, a P− region 6, and a P− region 21, and n type ions may be doped on a right region of the N-well 5 to form an N− region 9. In some implementations, the P− region 21 may not be formed (e.g., manufactured) in accordance with the illustrated electrostatic discharge circuit 1 of FIG. 1.

Referring to FIG. 7C, an oxide film may be formed by etching a portion of a surface of the electrostatic discharge circuit 100.

Figure 7F:
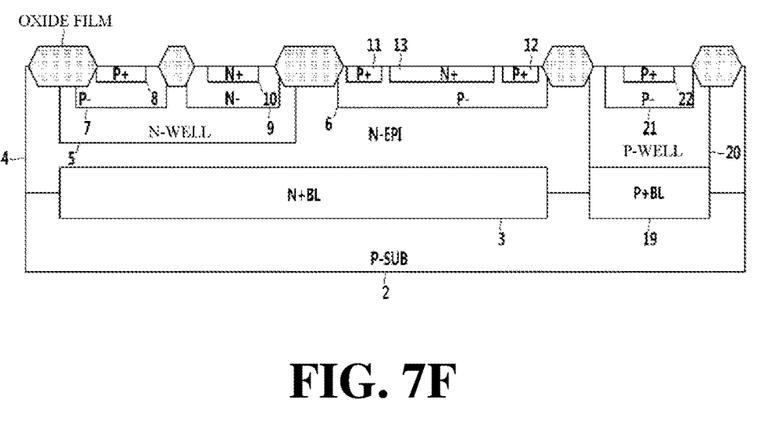

Referring to FIG. 7F, n type ions may be doped on a portion of a region of the N− region 9 and a portion of a region corresponding to a center of the P− region 6 to form an N+ region 10 and an N+ region 13. Further, p type ions may be doped on a portion of a region of the P− region 7, left and right regions of the P− region 6, and a portion of a region of the P− region 21 to form a P+ region 8, a P+ region 11, a P+ region 12, and a P+ region 22. In some implementations, the P+ region 22 may not be formed (e.g., manufactured) in accordance with the illustrated electrostatic discharge circuit 1 of FIG. 1.

Figure 7G:
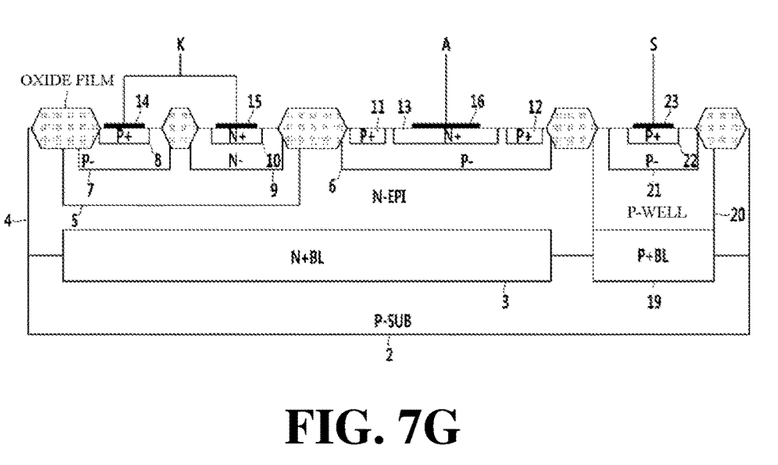

Referring to FIG. 7G, a cathode electrode 14, a cathode electrode 15, an anode electrode 16, and a sub-electrode 23 may be respectively formed on the P+ region 8, the N+ region 10, the anode electrode 16, and the P+ region 22 corresponding thereto. In some implementations, the sub-electrode 23 is not formed (e.g., manufactured) in accordance with the illustrated electrostatic discharge circuit 1 of FIG. 1.

Figure 8:
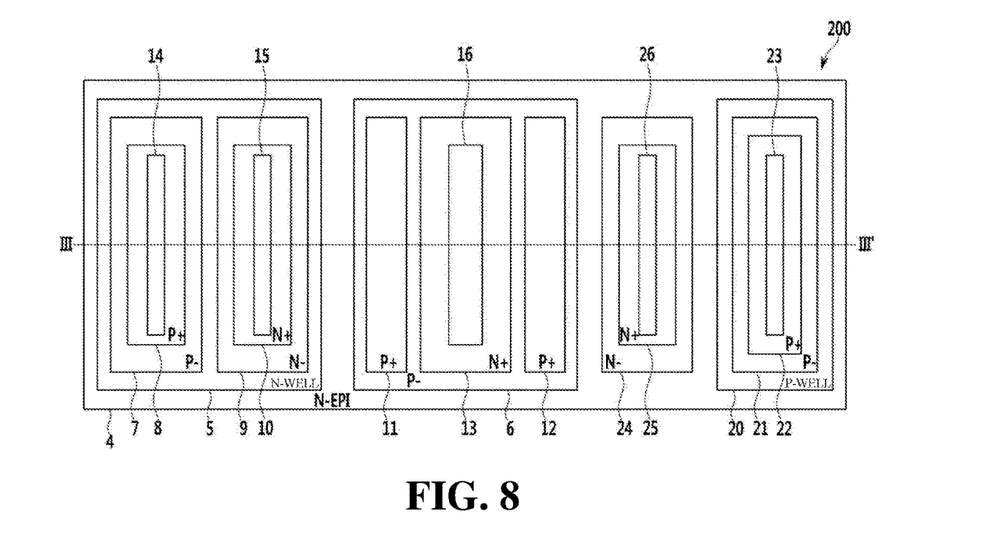
FIG. 8 is a plan view of an electrostatic discharge circuit according to another example embodiment.
Figure 9:
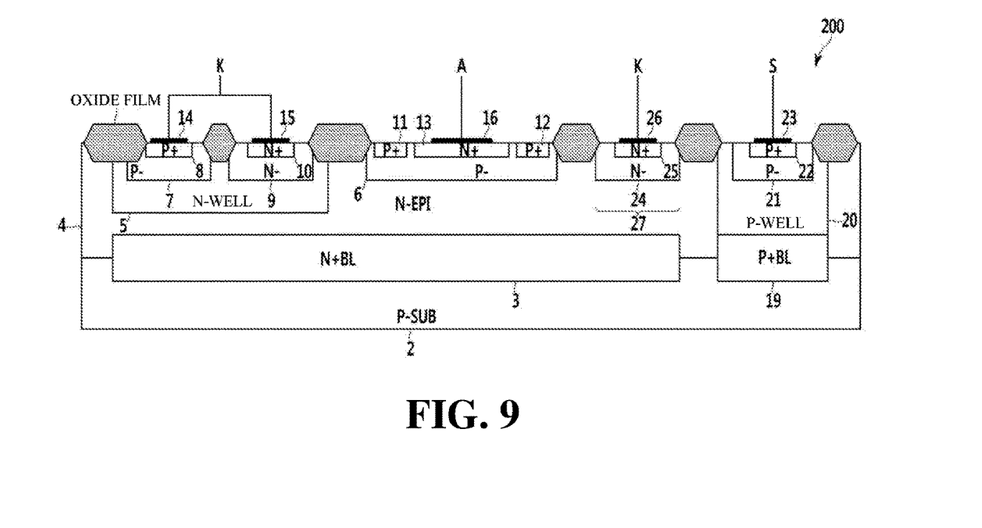
FIG. 9 is a cross-sectional view of the electrostatic discharge circuit of FIG. 8 taken along line III-III'.

FIG. 8 is a plan view of an electrostatic discharge circuit 200 according to another example embodiment. FIG. 9 is a cross-sectional view of the electrostatic discharge circuit 200 of FIG. 8 taken along line III-III'. The electrostatic discharge circuit 200 may include a cathode region.

Like elements described in FIGS. 8 and 9 that are the same as elements of the embodiment described in FIGS. 4 and 5 will not be described in detail below. Further, a circuit diagram of the electrostatic discharge circuit 200 may be similar to the circuit diagram of the electrostatic discharge circuit 100.

Referring to FIGS. 8 and 9, the electrostatic discharge circuit 200 may include an N− region 24 and an N+ region 25 of a cathode region, and a cathode electrode 26. Three cathode electrodes 14, 15, and 26 may be electrically connected to a cathode terminal K.

Although FIG. 8 illustrates the cathode electrode 26 as one electrode, there may be other configurations of the cathode electrode(s). For example, a plurality of cathode electrodes may be formed in the N+ cathode region 25.

In some implementations, as shown in FIG. 9, the N− region 24 may be formed in an additional cathode region 27 of an N-EPI layer 4, the N+ region 25 may be formed in the N− region 24, and the cathode electrode 26 may be formed on the N+ region 25.

In some implementations, as shown in FIG. 9 (but not shown in FIG. 8), an oxide film may be formed on a surface of the electrostatic discharge circuit 200. For example, the oxide film may be formed on the N-EPI layer 4.

In some implementations, a path of current flowing to the P− region 6 may be further provided as compared to the embodiments described in FIGS. 1 and 4. For example, a path of hole current generated by an avalanche breakdown between the N− region 24 and the P− region 6 may be provided by current caused by static electricity flowing to the cathode terminal K, and electric potential of the P− region 6 may be quickly increased.

Figure 10:
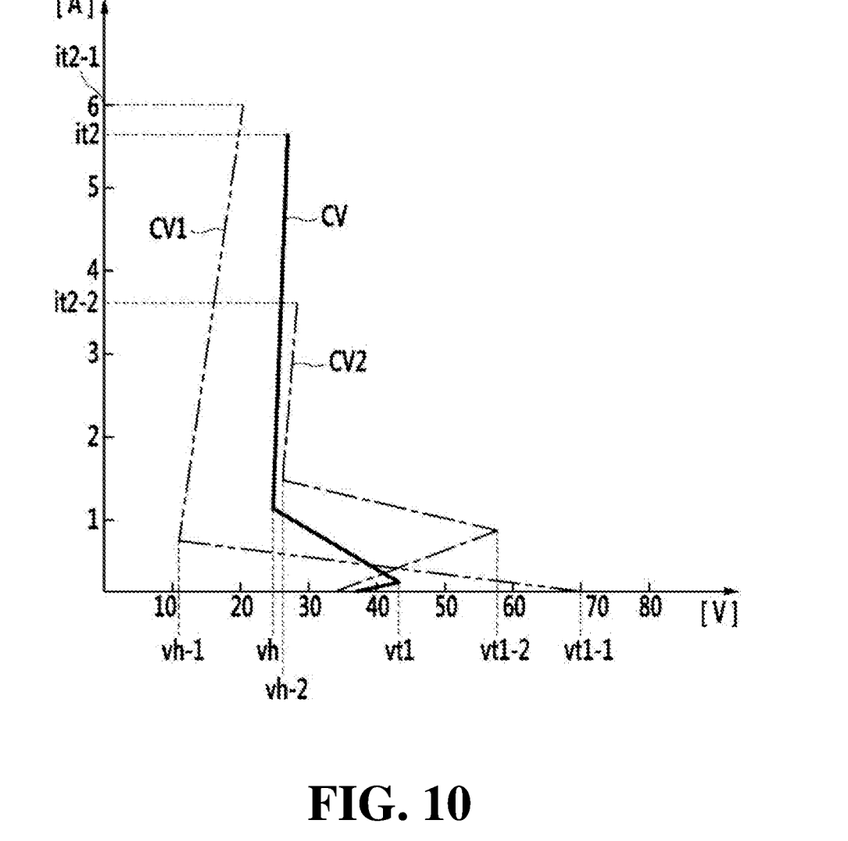
FIG. 10 is a graph comparing voltage-current characteristics of electrostatic discharge circuits according to example embodiments with those of electrostatic discharge circuits according to the related art.

FIG. 10 is a graph comparing voltage-current characteristics of electrostatic discharge circuits according to example embodiments with those of electrostatic discharge circuits according to the related art.

Referring to FIG. 10, a curve CV1 and a curve CV2 represent voltage-current characteristics of different types of electrostatic discharge circuits according to the related art, and a curve CV represents those of the electrostatic discharge circuits according to example embodiments.

An electrostatic discharge circuit should provide a trigger voltage appropriate to protect internal circuits. A holding voltage for an electrostatic discharge circuit applicable to a high-voltage circuit should be higher than a predetermined level. Furthermore, as current increases (i.e., a breaking current) when an electrostatic discharge circuit is broken, relatively large amount of current generated by static electricity may be discharged.

As shown in FIG. 10, in these voltage-current characteristics curves, a voltage at a point where the voltage starts to decrease after current flows is a trigger voltage, and a voltage at a point where the current sharply increases and the voltage is lowest is a holding voltage.

Further, as shown in FIG. 10, in the curve CV1, a trigger voltage (vt1-1) is about 70 V and is very high. Thus, an internal circuit may be broken before an electrostatic discharge is performed. In the curve CV2, a trigger voltage (vt1-2) is about 57 V and is lower than the trigger voltage (vt1-1) of the curve CV1. In the curve CV representing the electrostatic discharge circuits according to example embodiments, a trigger voltage vt1 is about 42 V and is lower than the trigger voltages (vt1-1) and (vt1-2) of the curves CV1 and CV2.

In the curve CV2, a breaking current (it2-2) is about 3.6 A, and thus discharge capability is low. In the curve CV1, a breaking current (it2-1) is about 6 A and is high but the trigger voltage (vt1-1) is extremely high as described above. Furthermore, in the curve CV1, a holding voltage (vh-1) is low, and is thus not appropriate for a high-voltage circuit. In the curve CV2, a holding voltage (vh-2) is high but discharge capability is low as described above. In the curve CV representing the electrostatic discharge circuits according to example embodiments, a holding voltage vh is high and a breaking current it2 is also high.

As described above, when a trigger voltage, a holding voltage, and a breaking current are taken into account, an electrostatic discharge may be provided more stably in the electrostatic discharge circuits according to example embodiments as compared to the electrostatic discharge circuit according to the related art.

Specific structural and functional details disclosed herein are merely representative for purposes of describing example embodiments. Example embodiments, however, may be embodied in many alternate forms and should not be construed as limited to only the embodiments set forth herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. An electrostatic discharge circuit, comprising:
    a substrate;
    an N+ buried layer in the substrate;
    an n-type epitaxial layer on the N+ buried layer and the substrate;
    a first P− region in an anode region of the n-type epitaxial layer;
    a first N+ region in the first P− region;
    an N-well in a cathode region of the n-type epitaxial layer;
    a first P+ region in the N-well; and
    a second N+ region located in the N-well,
    the first N+ region being located closer to the second N+ region than the first P+ region.

2. The electrostatic discharge circuit of claim 1, further comprising:
    a second P− region; and
    a first N− region in the N-well, the first P+ region being located in the second P− region, and the second N+ region being located in the first N− region.

3. The electrostatic discharge circuit of claim 1, further comprising:
    a second P+ region located in the first P− region, the second P+ region being at a left side of the first N+ region; and
    a third P+ region located in the first P− region, the third P+ region being at a right side of the first N+ region.

4. The electrostatic discharge circuit of claim 1, further comprising:
    a first transistor including the first P+ region, the N-well, and the first P− region;
    a second transistor including the N-well, the first P− region, and the first N+ region; and
    a resistor of the N-well.

5. An electrostatic discharge circuit, comprising:
    a substrate;
    a buried layer of a first conductivity type included in the substrate;
    an epitaxial layer on the buried layer of the first conductivity type and the substrate;
    a well region of the first conductivity type included in a cathode region of the epitaxial layer;
    a first lightly doped region of a second conductivity type and a second lightly doped region of the second conductivity type included in an anode region of the epitaxial layer and a portion of a region of the well region of the first conductivity type, the second conductivity type being opposite the first conductivity type;
    a first lightly doped region of the first conductivity type included in the well region;
    a first heavily doped region of the first conductivity type and a second heavily doped region of the first conductivity type included in a portion of the first lightly doped region of the second conductivity type and a portion of a region of the first lightly doped region of the first conductivity type, the second heavily doped region of the first conductivity type being located in the well region of the first conductivity type; and
    a first heavily doped region of the second conductivity type included in a portion of a region of the second lightly doped region of the second conductivity type, the first heavily doped region of the first conductivity type being located closer to the second heavily doped region of the first conductivity type than the first heavily doped region of the second conductivity type.

6. The electrostatic discharge circuit of claim 5, further comprising:
   a second heavily doped region of the second conductivity type included in a left region of the first heavily doped region of the first conductivity type in the first lightly doped region of the second conductivity type; and
   a third heavily doped region of the second conductivity type included in a right region of the first heavily doped region of the first conductivity type in the first lightly doped region of the second conductivity type.

7. The electrostatic discharge circuit of claim 5, further comprising:
   a cathode electrode on each of the first heavily doped region of the second conductivity type and the second heavily doped region of the first conductivity type; and
   an anode electrode on the first heavily doped region of the first conductivity type.

8. The electrostatic discharge circuit of claim 5, wherein the buried layer includes high-concentration n type ions implanted into a first sub-region including all of the cathode and anode regions.

9. The electrostatic discharge circuit of claim 8, further comprising:
   a buried layer of the second conductivity type in a second sub-region on the substrate, a location of the second sub-region being different from a location of the first sub-region of the buried layer of the first conductivity type;
   a well region of the second conductivity type included in the buried layer of the second conductivity type;
   a third lightly doped region of the second conductivity type included in a portion of a region of the well region of the second conductivity type; and
   a fourth heavily doped region of the second conductivity type included in a portion of a region of the third lightly doped region of the second conductivity type.

10. The electrostatic discharge circuit of claim 9, wherein the buried layer of the second conductivity type includes high-concentration p type ions implanted into the second sub-region.

11. An electrostatic discharge circuit, comprising:
   a substrate;
   a buried layer of a first conductivity type in the substrate;
   an epitaxial layer on the buried layer of the first conductivity type and the substrate;
   a first lightly doped region of a second conductivity type in an anode region of the epitaxial layer, the second conductivity type being opposite the first conductivity type;
   a first heavily doped region of the first conductivity type in the first lightly doped region of the second conductivity type;
   an well region of the first conductivity type in a cathode region of the epitaxial layer;
   a first heavily doped region of the second conductivity type in the well region of the first conductivity type; and
   a second heavily doped region of the first conductivity type located in the well region of the first conductivity type,
   the first heavily doped region of the first conductivity type being located closer to the second heavily doped region of the first conductivity type than the first heavily doped region of the second conductivity type.

12. The electrostatic discharge circuit of claim 11, further comprising:
   a second lightly doped region of the second conductivity type; and
   a first lightly doped region of the first conductivity type in the well region of the first conductivity type, the first heavily doped region of the second conductivity type being located in the second lightly doped region of the second conductivity type, and the second heavily doped region of the first conductivity type being located in the first lightly doped region of the first conductivity type.

13. The electrostatic discharge circuit of claim 11, further comprising:
   a second heavily doped region of the second conductivity type located in the first lightly doped region of the second conductivity type, the second heavily doped region of the second conductivity type being at a left side of the first heavily doped region of the first conductivity type; and
   a third heavily doped region of the second conductivity type located in the first lightly doped region of the second conductivity type, the third heavily doped region of the second conductivity type being at a right side of the first heavily doped region of the first conductivity type.

14. The electrostatic discharge circuit of claim 11, wherein the first heavily doped region of the second conductivity type and the second heavily doped region of the first conductivity type are connected to a cathode terminal, and the first heavily doped region of the first conductivity type is connected to an anode terminal.

15. The electrostatic discharge circuit of claim 11, further comprising:
   a first transistor including the first heavily doped region of the second conductivity type, the well of the first conductivity type, and the first lightly doped region of the second conductivity type;
   a second transistor including the well of the first conductivity type, the first lightly doped region of the second conductivity type, and the first heavily doped region of the first conductivity type; and
   a resistor of the well region of the first conductivity type.

16. The electrostatic discharge circuit of claim 11, further comprising:
   a buried layer of the second conductivity type located in a sub-region on the substrate, the sub-region having a location different from a location of the buried layer of the first conductivity type;
   a well of the second conductivity type on the buried layer of the second conductivity type in the epitaxial layer;
   a third lightly doped region of the second conductivity type in the well region of the second conductivity type; and
   a fourth heavily doped region of the second conductivity type in the third lightly doped region of the second conductivity type.

17. The electrostatic discharge circuit of claim 16, further comprising:
   a first transistor including the first heavily doped region of the second conductivity type, the well region of the first conductivity type, and the first lightly doped region of the second conductivity type;
   a second transistor including the well region of the first conductivity type, the first lightly doped region of the second conductivity type, and the first heavily doped region of the first conductivity type;

a resistor of the well region of the first conductivity type; and a third transistor including the first lightly doped region of the second conductivity type, the epitaxial layer, and the third lightly doped region of the second conductivity type.

18. The electrostatic discharge circuit of claim 16, wherein the fourth heavily doped region of the second conductivity type is connected to the substrate.

19. The electrostatic discharge circuit of claim 11, further comprising:

a second lightly doped region of the first conductivity type located in the epitaxial layer, the second lightly doped region of the first conductivity type being symmetrical to the well region of the first conductivity type with respect to the first lightly doped region of the second conductivity type; and a third heavily doped region of the first conductivity type in the second lightly doped region of the first conductivity type.

20. The electrostatic discharge circuit of claim 19, wherein the first heavily doped region of the second conductivity type, the second heavily doped region of the first conductivity type, and the third heavily doped region of the first conductivity type are connected to a cathode terminal, and the first heavily doped region of the first conductivity type is connected to an anode terminal.

\* \* \* \* \*